US007087442B2

(12) United States Patent
Oppermann et al.

(10) Patent No.: US 7,087,442 B2
(45) Date of Patent: Aug. 8, 2006

(54) PROCESS FOR THE FORMATION OF A SPATIAL CHIP ARRANGEMENT AND SPATIAL CHIP ARRANGEMENT

(75) Inventors: Hans-Hermann Oppermann, Berlin (DE); Elke Zakel, Falkensee (DE); Ghassem Azdasht, Berlin (DE); Paul Kasulke, Berlin (DE)

(73) Assignee: Pac Tech-Packaging Technologies GmbH, Nauen (DE)

( * ) Notice: Subject to any disclaimer, the term of this patent is extended or adjusted under 35 U.S.C. 154(b) by 138 days.

(21) Appl. No.: 09/962,553

(22) Filed: Sep. 24, 2001

(65) Prior Publication Data

US 2002/0009828 A1    Jan. 24, 2002

Related U.S. Application Data

(62) Division of application No. 09/553,123, filed on Apr. 19, 2000, now abandoned, which is a division of application No. 08/847,961, filed on Apr. 22, 1997, now Pat. No. 6,281,577.

(30) Foreign Application Priority Data

Jun. 28, 1996   (DE) ................ 196 26 126

(51) Int. Cl.
| G01R 31/26 | (2006.01) |
| H01L 21/66 | (2006.01) |
| H01L 21/44 | (2006.01) |
| H01L 21/48 | (2006.01) |
| H01L 21/50 | (2006.01) |

(52) U.S. Cl. .............. 438/15; 438/109; 438/117; 438/723; 257/E25.006; 257/E25.013; 257/E25.027

(58) Field of Classification Search ............ 438/109, 438/117, FOR. 366, FOR. 367, FOR. 368, 438/FOR. 426, 15, FOR. 386, FOR. 387; 257/686, 700, 723, E25.006, E25.013, E25.027

See application file for complete search history.

(56) References Cited

U.S. PATENT DOCUMENTS

| 3,105,869 | A | * | 10/1963 | Branch et al. ............ 361/803 |
| 4,770,640 | A |   | 9/1988 | Walter .................... 439/69 |
| 4,833,568 | A | * | 5/1989 | Berhold .................. 361/690 |
| 4,862,249 | A | * | 8/1989 | Carlson ................... 257/668 |
| 4,922,378 | A | * | 5/1990 | Malhi et al. ............. 361/706 |
| 4,953,005 | A | * | 8/1990 | Carlson et al. .......... 257/666 |
| 4,983,533 | A |   | 1/1991 | Go ......................... 437/7 |

(Continued)

FOREIGN PATENT DOCUMENTS

EP    0 521 735    1/1993

(Continued)

OTHER PUBLICATIONS

IBM Technical Disclosure Bulletin, vol. 38, No. 01, pp. 69-70 (Jan. 1995).

(Continued)

*Primary Examiner*—David E. Graybill
(74) *Attorney, Agent, or Firm*—Darby & Darby

(57) ABSTRACT

Process for the formation of a spatial chip arrangement having several chips (32, 36, 37, 38, 39) arranged in several planes and electrically connected to one another, in which the chips are connected via their peripheral connection surfaces (33) to assigned conducting paths (23) of a conducting-path structure (24, 25) arranged on at least one carrier substrate (21, 22) by the chips being arranged transverse to the longitudinal extent of the carrier substrate.

6 Claims, 3 Drawing Sheets

U.S. PATENT DOCUMENTS

| | | | |
|---|---|---|---|
| 5,006,925 A | 4/1991 | Bregman et al. | 357/82 |
| 5,016,138 A | 5/1991 | Woodman | 361/381 |
| 5,031,072 A * | 7/1991 | Malhi et al. | 361/706 |
| 5,151,559 A * | 9/1992 | Conru et al. | 174/52.4 |
| 5,224,023 A | 6/1993 | Smith et al. | 361/412 |
| 5,239,447 A * | 8/1993 | Cotues et al. | 361/744 |
| 5,241,450 A * | 8/1993 | Bernhardt et al. | 361/689 |
| 5,247,423 A | 9/1993 | Lin et al. | 361/719 |
| 5,279,029 A * | 1/1994 | Burns | 29/856 |
| 5,285,571 A | 2/1994 | Gorczyca et al. | 29/848 |
| 5,313,096 A | 5/1994 | Eide | 257/686 |
| 5,327,327 A * | 7/1994 | Frew et al. | 361/784 |
| 5,343,075 A * | 8/1994 | Nishino | 257/686 |
| 5,345,205 A | 9/1994 | Kornrumpf | 333/246 |
| 5,397,916 A | 3/1995 | Normington | 257/686 |
| 5,425,493 A * | 6/1995 | Interrante et al. | 228/110.1 |
| 5,448,511 A | 9/1995 | Paurus et al. | 365/52 |
| 5,466,634 A * | 11/1995 | Beilstein et al. | 438/15 |
| 5,475,920 A * | 12/1995 | Burns et al. | 29/856 |
| 5,514,907 A | 5/1996 | Moshayedi | 257/723 |
| 5,517,754 A * | 5/1996 | Beilstein et al. | 29/840 |
| 5,566,051 A * | 10/1996 | Burns | 361/704 |
| 5,567,654 A * | 10/1996 | Beilstein et al. | 438/4 |
| 5,588,205 A * | 12/1996 | Roane | 29/830 |
| 5,592,364 A * | 1/1997 | Roane | 361/735 |
| 5,602,420 A | 2/1997 | Ogata et al. | 257/686 |
| 5,604,377 A | 2/1997 | Palagonia | 257/685 |
| 5,646,446 A | 7/1997 | Nicewarner, Jr. et al. | 257/723 |
| 5,648,684 A | 7/1997 | Bertin et al. | 257/685 |
| 5,653,381 A * | 8/1997 | Azdasht | 228/254 |
| 5,656,856 A | 8/1997 | Kweon | 257/686 |
| 5,754,405 A | 5/1998 | Derouiche | 361/744 |
| 5,790,380 A * | 8/1998 | Frankeny | 361/735 |
| 5,793,116 A * | 8/1998 | Rinne et al. | 257/777 |
| 5,828,031 A * | 10/1998 | Pattanaik | 219/121.63 |
| 5,854,534 A * | 12/1998 | Beilin et al. | 257/691 |
| 5,963,793 A * | 10/1999 | Rinne et al. | 438/107 |
| 6,121,676 A | 9/2000 | Solberg | 257/686 |
| 6,188,127 B1 * | 2/2001 | Senba et al. | 257/686 |
| 6,208,521 B1 | 3/2001 | Nakatsuka | 361/749 |
| 6,227,437 B1 * | 5/2001 | Razon et al. | 228/254 |
| 6,838,060 B1 * | 1/2005 | Chapus et al. | 422/190 |

FOREIGN PATENT DOCUMENTS

| | | |
|---|---|---|
| EP | 0 527 044 | 2/1993 |
| EP | 0 810 661 | 12/1997 |
| JP | 3-64088 | 3/1991 |
| JP | 03171646 A * | 7/1991 |
| JP | 6-13727 | 1/1994 |
| WO | WO 82/04161 | 11/1982 |

OTHER PUBLICATIONS

IBM Technical Disclosure Bulletin, vol. 38, No. 06, p. 1 (Jun. 1995).

* cited by examiner

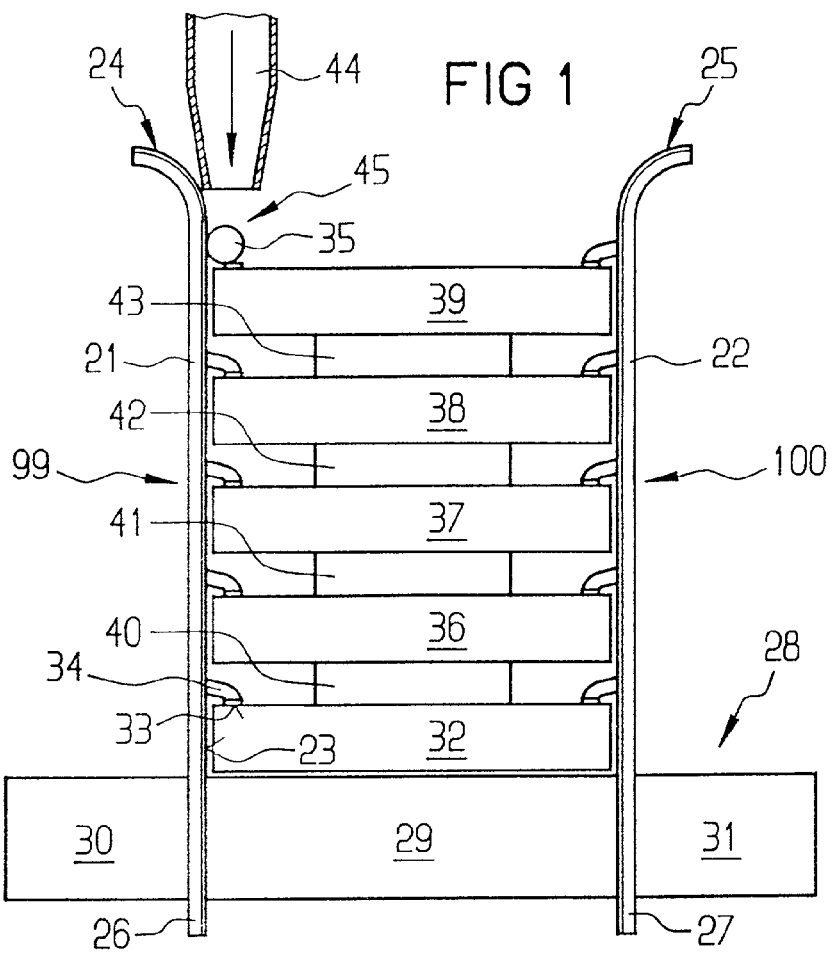
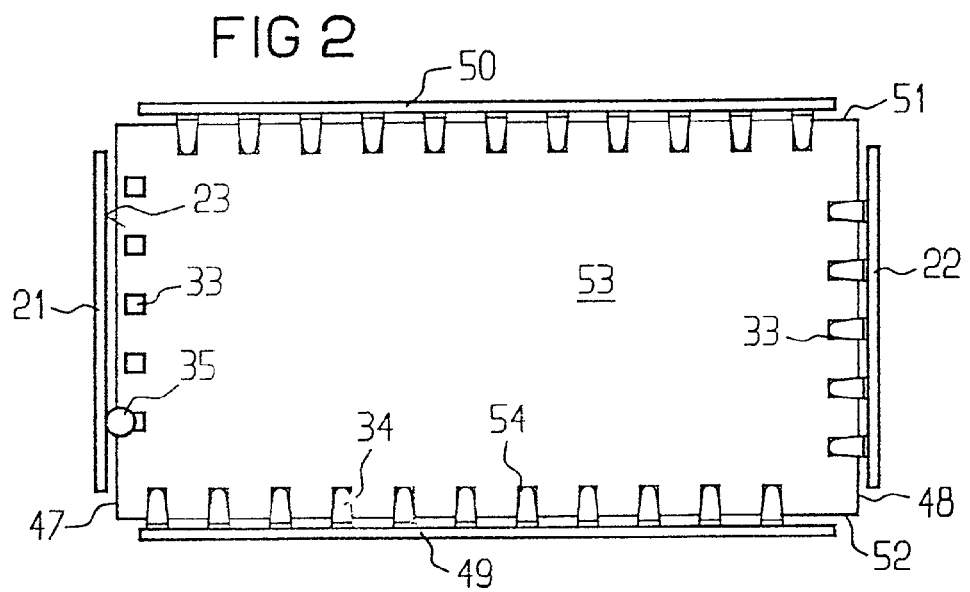

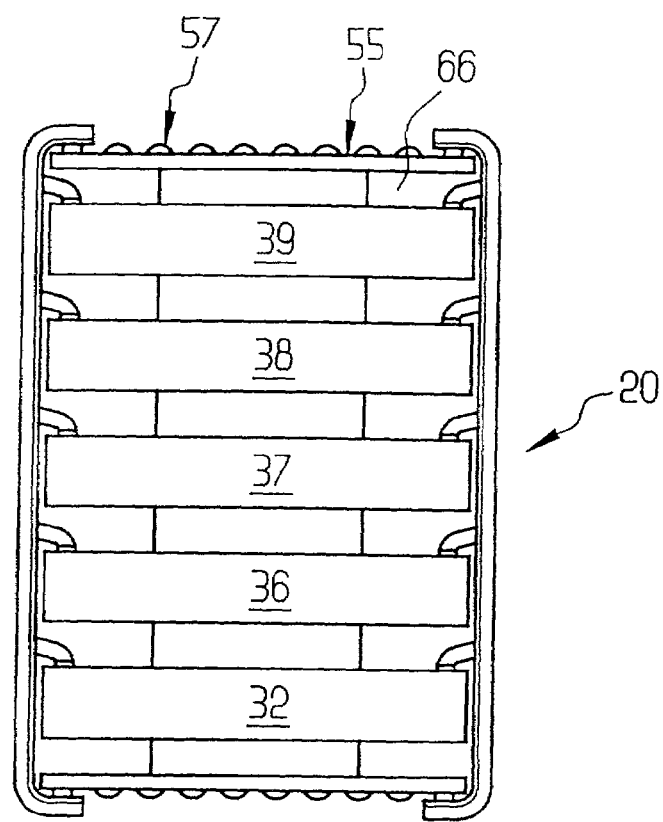
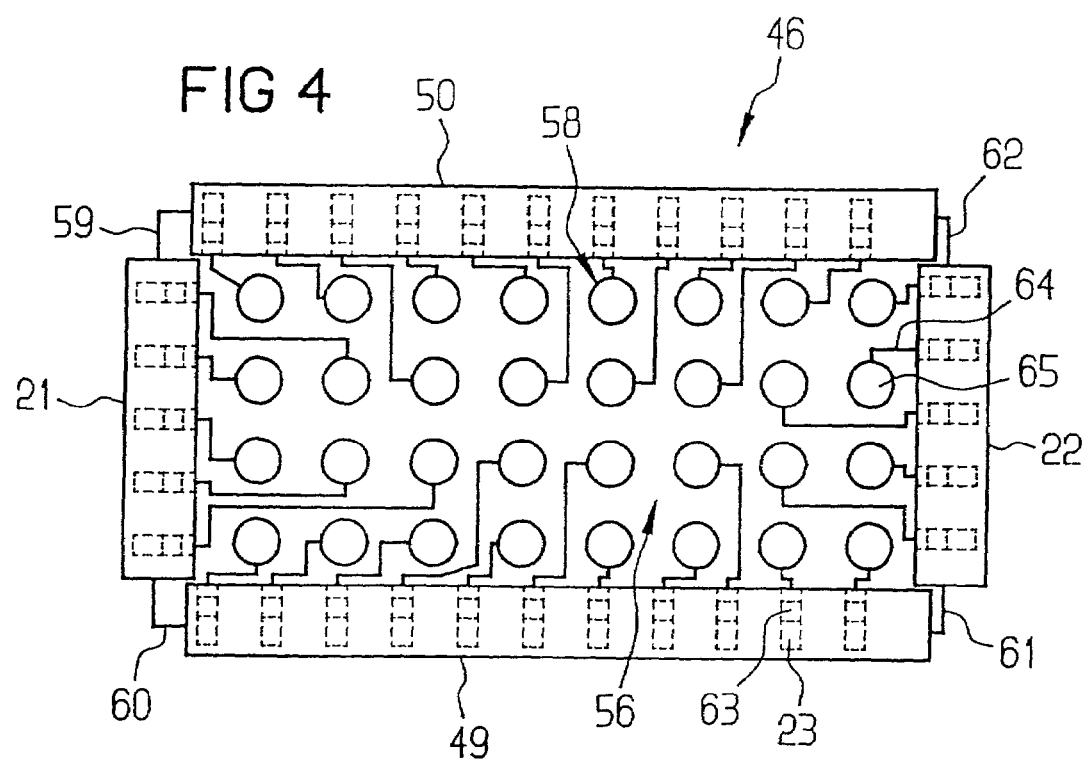

PROCESS FOR THE FORMATION OF A SPATIAL CHIP ARRANGEMENT AND SPATIAL CHIP ARRANGEMENT

This is a division of application Ser. No. 08/847,961 filed Apr. 22, 1997 which is incorporated herein by reference in its entirety. Ser. No. 09/553,123 filed Apr. 19, 2000 now abandoned, is also a division of application Ser. No. 08/847, 961, which is now U.S. Pat. No. 6,281,577.

BACKGROUND OF THE INVENTION

The present invention relates to a process for the formation of a spatial chip arrangement having several chips arranged in several planes and electrically connected to one another, in which the chips are connected via their peripheral connection surfaces to assigned conducting paths of a conducting-path structure which is arranged on at least one carrier substrate by the chips being arranged transverse to the longitudinal extent of the carrier substrate.

With the increasing miniaturisation of electronic appliances such as portable telephone for example, also generally designated as "handy", or portable computers, known by the expression "notebook", the demands regarding integration density of the electronic modules employed therein also increase. To a particular degree this is unquestionably the case with memory modules which are utilized in such appliances or memory expansions which may be used optionally. At the present time, by way of structural design for such highly integrated memory modules use is made as a rule of so-called "multi-chip modules" (MCM) in which the individual chips are arranged above one another and electrically connected to one another. By reason of the high integration density—that is to say, the arrangement of a plurality of chips within an extremely small space—the probability of failure of such a memory module also increases of course, since for failure of a component it is sufficient if only one of the chips which are processed in a plurality is defective. In order to be able to eliminate failure of a component to the greatest possible extent during operation of the highly integrated modules, an examination of the modules has hitherto been undertaken after completion and prior to delivery or incorporation into the electronic appliance in question. This is associated, on the one hand, with an additional component test following the actual manufacturing process. On the other hand, the implementation of a component test only after finishing the complete component means that in the event of a component failure, which as a rule is caused only by the failure of an individual chip, the entire component is rejected.

SUMMARY OF THE INVENTION

The object underlying the present invention is therefore to propose a process for the formation of a spatial chip arrangement despite the fact that a high integration density is achieved, creates an opportunity for the early detection of faults so that classification of the complete component as a reject can be prevented to the greatest possible extent.

In accordance with the invention it is proposed, with a view to forming a spatial chip arrangement having several chips arranged in various planes and electrically connected to one another, to contact the chips via the peripheral connecting surfaces with assigned conducting paths of a conducting-path structure that is arranged on at least one carrier substrate. In this regard the chips will be arranged transverse to the rectilinearly aligned carrier substrate.

The invention offers, on the one hand, the possibility of arranging the chips in a space-saving structure and, on the other hand, the possibility of a simple electrical examination, during manufacture of the stacked chip arrangement, of the chip that is connected to the carrier substrate.

The space-saving arrangement of the chips is created by the transverse arrangement of the chips.

A particularly high integration density can be produced by the chips being brought with their peripheral connection surfaces arranged along a lateral edge into a connecting position adjacent to the conducting paths and transverse to the longitudinal extent of the conducting paths and then by a connection being effected between pairings, assigned respectively to one another, of conducting path an connection surface via a connecting material that is applied between the respective conducting path and the assigned connection surface.

The implementation of the process proves to be particularly advantageous if, after a chip has been brought into contact with the carrier substrate, an electrical examination of the chip is carried out via the connecting-path structure of the carrier substrate that is connected to a test device.

It proves to be advantageous if, with a view to preparing the contacting of the chips, the carrier substrate or substrates is/are fixed with one end in a clamping device. Hence the clamping device may also be used as a test device.

In particular in the case where it is a question of chips with reverse-side metallisation it proves to be advantageous if in each case prior to making contact with an additional chip a spacer device is arranged on the upper side of the previously contacted chip. On one the hand, given a suitable choice of material for the spacer device, an insulation between the chips is achieved. On the other hand, a static arrangement is also made possible. This stabilisation effect can be intensified still further if an adhesive material, for example an application of adhesive, is chosen for the spacer device.

In the case where a soldering material is used by way of connecting material it proves to be advantageous if the connecting material is applied in the form of isolated deposits of connecting material onto the conducting paths and/or the connecting surfaces and is then activated by remelting.

In order, finally, to enable an to external contracting of the spatial chip arrangement that is as simple as possible, it proves to be particularly advantageous if, after the last chip has been brought into contact, a projecting length of the carrier substrate is firstly folded over the upper side of the chip and connected to the upper side and then a through-contact is made from the reverse side of the carrier substrate that is connected to the chip-connection surfaces. Alternatively it is also possible to make use, right from the beginning, of carrier substrates that are provided with an appropriate through-contact.

An advantageous alternative to this is obtained if, with a view to forming an external-contact arrangement on the chip arrangement prior to contacting the first chip or after contacting the last chip, a printed circuit board or a modified chip having an external-contact arrangement arranged on the outside and distributed in planar manner is contacted with the conducting paths of the carrier substrate via internal contacts arranged on the periphery of the printed circuit board or on the periphery of the chip and connected to the external-contact arrangement by means of a connection conducting-path structure.

In order to achieve a chip arrangement that is sealed off from environmental influence to the greatest possible extent and that has, moreover, a mechanical stability that is as great as possible, it is advantageous if, after contacting the desired number of chips, the chip arrangement produced is sealed with a view to forming a casing.

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

The embodiments of the spatial chip arrangement are illustrated in more detail below by illustrating the processes for its manufacture with reference to the drawings. In the drawings, wherein like reference numerals delineate similar elements throughout the several views:

FIG. 1 an embodiment example of a stacked chip arrangement during manufacturing in a variant of the process according to the invention;

FIG. 2 a top view of a chip represented in FIG. 1;

FIG. 3 a side view of the now finished chip arrangement that is shown in FIG. 1 during the manufacturing process;

FIG. 4 a top view of a chip arrangement that is slightly modified in comparison with FIG. 3;

DETAILED DESCRIPTION OF A PREFERRED EMBODIMENT

Figure 5:
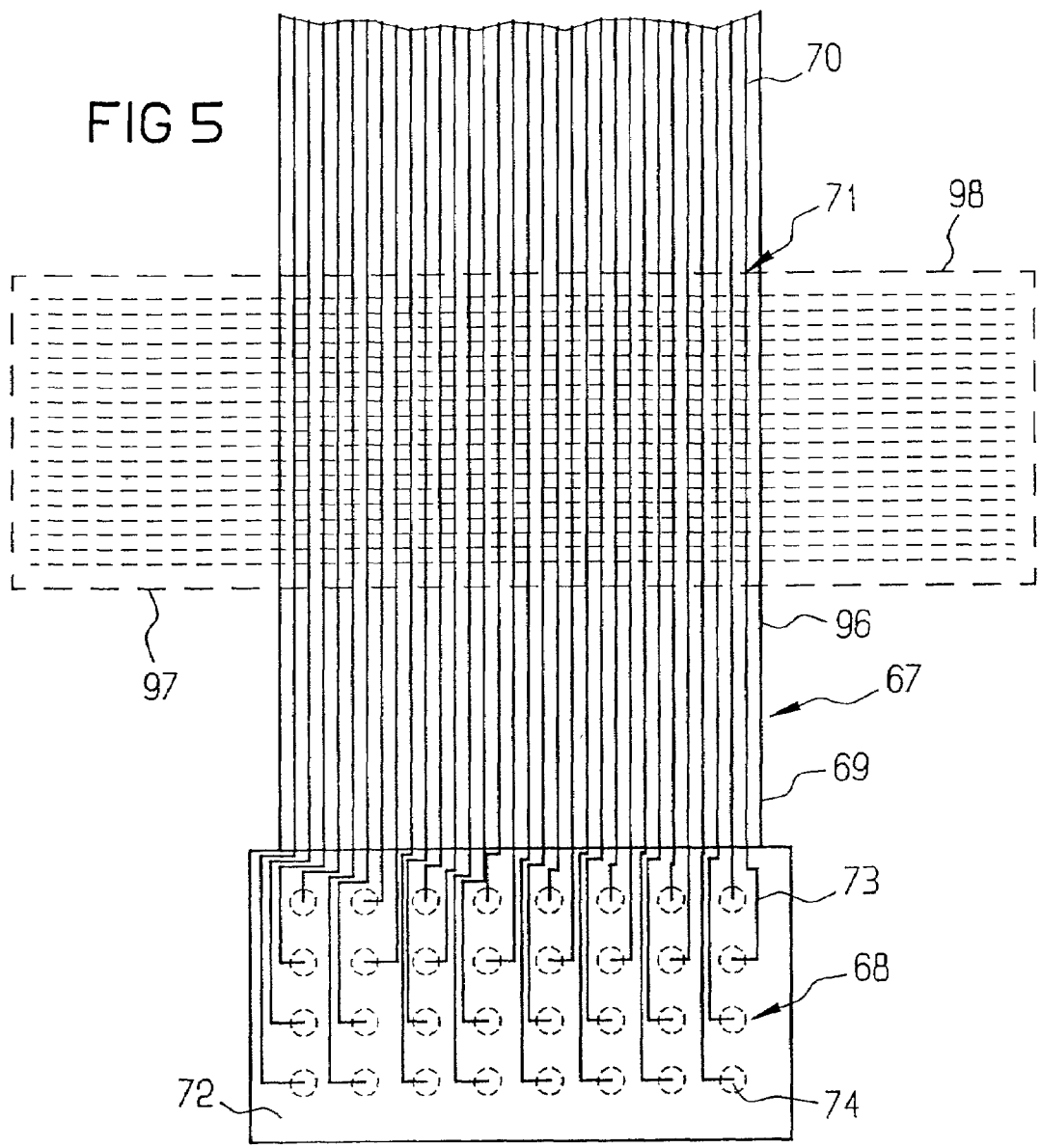
FIG. 5 the representation of a carrier substrate for the formation of a chip arrangement.

FIG. 1 shows a process stage in the course of the manufacture of a chip-stack arrangement 20 that is represented in FIG. 3 in its final state. With a view to forming the chip-stack arrangement 20 (FIG. 3), in the case of the embodiment example currently represented two flexibly constructed carrier substrate 21, 22 are arranged with their conducting-path structures 24, 25, comprising a plurality of conducting paths 23, located opposite one another. With a view to fixing the carrier substrates 21, 22 in the relative position represented in FIG. 1, the ends 26, 27 of the carrier substrates 21, 22 are accommodated in a clamping device 28. The clamping device 28 comprises in the present case a spacer block 29, against which the ends 26, 27 of the carrier substrates 21 and 22 respectively are held clamped by clamping jaws 30, 31. The spacer block 29 is so dimensioned that a first chip 32 can be positioned in the manner represented in FIG. 1 between the carrier substrates 21, 22 with its peripheral connection surfaces 33, here in two rows extending perpendicular to the plane of the drawing, adjacent to the conducting paths 23 of the conducting-path structures 24, 25.

For this purpose the chip 32 rests with its reverse side in contact with the spacer block 29 of the clamping device 28.

In the case of the configuration represented in FIG. 1 the connection surfaces 33 of the chip 32 are provided via soldered connections 34 consisting of a remelted deposit of soldering material 35 with a view to forming an electronically conductive connection between the connection surfaces 33 and the assigned conducting paths 23 of the conducting path structures 24 and 25.

From FIG. 1 it becomes clear that the chip-stack arrangement 20 (FIG. 3) is constructed in the manner of a sandwich from an alternating arrangement of the additional chips 36 to 39 and intermediate layers of adhesive 40 to 43. These layers of adhesive 40 43 serve, on the one hand, to form a spacer device between adjacent chips 32,36 and 36,37 and 37, 38 and 39 and also, on the other hand, on account of the flexibility carrier substrates 21, 22, to bring about relative fixation of the entire arrangement.

As can be further gathered from FIG. 1, as represented in FIG. 1 on the basis of an example fo the connection of the topmost chip 39, the deposits of solder material 35 for producing the soldered connections 34 are placed individually in positionally precise manner in the connecting region 45 between the connection surfaces 33 and the conducting paths 23 by means of a tool that takes th form of an application capillary 44. The necessary thermal energy for establishing the soldered connection by remelting may, with appropriate design of the application capillary 44 as a thermode device, be effected by the latter itself or also by a remelting device that is separate from it.

With the aid of the top view illustrated in FIG. 2 of a chip 53, at the same time a variant differing from the representation of the chip-stack arrangement 20 in FIG. 3 for the purpose of forming a chip-stack arrangement 46 illustrated in FIG. 4 is represented in which, differing from the representation in FIG. 1, in addition to the two carrier substrates 21, 22 arranged in opposing manner, which here are assigned to transverse sides 47, 28 of the chip 53, two further carrier substrates 49,50 are provided which are assigned to longitudinal sides 51, 52 of the chip 53.

The chip-stack arrangement 46 represented in FIGS. 2 and 4 with here a total of four carrier substrates 21, 22 and 49, 50 is suitable, as is clearly evident from FIG. 2, for combination with chips of the same type as the chip 53 that are provided not only with two rows of peripheral connection surfaces 33, arranged in opposing manner, but moreover with two additional peripheral rows of connection surfaces 54, arranged in opposing manner.

Corresponding to the remarks made with reference to FIG. 1, the connection surfaces 54 of the chip 53 are, like the connection surfaces 33 of the chip 53, also connected via soldered connections 34 to the conducting paths 23 of the carrier substrates 21, 22 and 49, 50. Of course, it is also possible, in a manner differing from the soldering-material connections proposed here, for use to be made of other types of connection and connecting materials for bringing the connection surfaces 33 and 54 of the chips into electrical contact. For example, conductive adhesives may also be employed.

Irrespective of whether, with respect to the particular embodiment, it is a question of a chip-stack arrangement 20 or a chip-stack arrangement 46, the chip-stack arrangement is built up in the manner represented in FIG. 1—that is to say, by means of a sandwich-type layering of the chips. In this regard it is advisable, with a view to increasing the mechanical stability of the entire chip-stack arrangement 20 or 46, particularly in the case where use is made of flexibly constructed carrier substrates 21, 22 and 49, 50 to connect the individual chips 32 to 39 or 53 to one another by means of spacer devices 40 to 43 of adhesive design.

In the case where use is made of inherently rigid carrier substrates it is possible to dispense with said devices. Depending on the configuration of the connection surfaces of the chips that are to be integrated into a chip-stack arrangement, a chip-stack arrangement can also be built up with only one carrier substrate. In the case of carrier substrates of inherently rigid design the chip-stack arrangement can also be built up with an orientation differing from the orientation of the carrier substrates 21, 22 represented in FIG. 1—for example, with horizontal alignment of the carrier substrate or substrates.

Irrespective to the construction of the carrier substrates that are used in order to build up a chip-stack arrangement, the structure of a chip-stack arrangement 20 represented by way of example in FIG. 1 enables a component test of the individual chips 32 to 39 that takes place almost simultaneously with the composition of the chip-stack arrangement. For this purpose, after each application of an individual chip starting with chip 32 and completion of the electrically conductive connections-here taking the form of a soldered connection 34—to the conducting paths 23 of the carrier substrates 21, 22, an electrical examination of the particular chip last inserted is carried out via the conducting paths 23 of the carrier substrates 21, 22. A test device suitable for this purpose, which is not represented in any detail, can be connected as a separate device to the ends 26 and 27 of the carrier substrates 21, 22 that are clamped in the clamping device 28. But there is also the possibility of designing the clamping device 28, in particular the spacer block 29 of the clamping device 28, as an electrical test device or at least as a contact device for an electrical test device.

The arrangement represented in FIG. 1 for the formation of a chip-stack arrangement 20 enables, in particularly simple manner, a continuous manufacture of chip-stack arrangements 20. To this end the carrier substrates 21 and 22 are held ready in the form of endless substrates arranged on rollers or a similar supply device and are moved forward one carrier-substrate section 99, 100 at a time following a release of the clamping device 28, the carrier-substrate sections 99, 100 being so dimensioned that the desired number of chips can be arranged between the carrier-substrate sections 99, 100 with a view to forming the chip-stack arrangement 20. After completion of the arrangement the carrier-substrate sections 99, 100 which are now connected to the chips are separated by means of a suitable separating device, which is not represented here, adjacent to the clamping device 28 so that, as a result of a further feed movement, the next carrier-substrate sections 99, 100 can be equipped with chips.

In order to simplify contacting of the finished chip-stack arrangement 20 or 46, the chip-stack arrangement 20 or 46 may be sealed at least to one side with a printed circuit board 55 or 56 respectively which, as represented by way of example in FIGS. 3 and 4, may be provided with an external contact-surface arrangement 57 or 58 in the manner of a "ball-grid array".

As becomes clear in particular from the top view represented in FIG. 4, for the purpose of connection to the printed circuit board 56 the upper ends of the carrier substrates 21, 22 and 49, 50, which here are of flexible construction, are folded over peripheral contact edges 59, 60, 61 and 62 of the printed circuit board 56 in such a way that the conducting paths 23 of the carrier substrates 21, 22 and 49, 50 can be contacted in a covering position with internal contact surfaces 63 of the printed circuit board 56. From the internal contact surfaces 63 contact paths 64 lead to the individual external contact surfaces 65 of the printed circuit board 56 that are configured in the external contact-surface arrangement 58 described previously.

As FIG. 3 shows, a printed circuit board 55 or another device enabling an external contact-surface arrangement can be arranged both at the upper and at the lower end of a chip-stack arrangement 20 or 46. With a view to forming a sealed case for the chips 32 and 36 to 39 or 53 that are arranged in the chip-stack arrangement 20 or in the chip-stack arrangement 20 or in the chip-stack arrangement 46, the chip-stack arrangement 20 or 46 is filled out in the chip interspaces 66 represented in FIG. 3 on the basis of an example of the chip-stack arrangement 20 with a sealing material which, furthermore, may also additionally encase the carrier substrates. Chip-stack arrangements that are encased and provided with an external contact-surface arrangement can be used to particular advantage in connection with SMD technology.

FIG. 5 shows, represented by fully drawn lines, a flexible carrier substrate 67 in a representation that is spread out in the plane, in which an external contact-surface arrangement 68 is formed integrally in a flexible carrier layer 69 of the carrier substrate 67. To this end the conducting-path structure 71 that is composed of individual conducting paths 70 merges in the end region of the carrier substrate 67 with a connection conducting-path structure 72. The connection conducting-path structure 72 comprises contact paths 73 which are arranged on the same side of the carrier layer 69 as the conducting paths 70 of the conducting-path structure 71. On the opposite side of the carrier layer 69, located opposite the free ends of the contact paths 73, external contact surfaces are provided that are formed here by soldering points 74 which are connected to the contact paths 73 via through-contacts that are not represented in any detail.

The carrier substrate 67 represented in FIG. 5 by solid lines enables, analogously to the two carrier substrates 21, 22 represented in FIG. 1, the combination of several chips 32 and 36 to 39 so as to form a chip-stack arrangement, whereby the carrier substrate 67 represented by solid lines is suitable for combination with chips that, like the chips 32 and 36 to 39 represented in FIG. 1, comprise two opposite rows of peripheral connection surfaces. Proceeding from the embodiment example represented in FIG. 5, the carrier substrate 67, which is provided with a total of 32 conducting paths 23, is suitable to connect chips comprising 16 peripheral connection surfaces in each of two opposite rows. The connection of the chip-connection surfaces to the conducting paths 23 can be effected in a manner analogous to that elucidated with reference to FIG. 1. As indicated in FIG. 5 by two lateral strands 97, 98 attached laterally to a principal strand 96 of the carrier substrate 61 and represented by a dashed line, a carrier substrate which in the manner of the carrier substrate 67 is provided with an integrated arrangement of external-contact connection surfaces can also be sued for equipping with chips comprising a total of four rows of peripheral connections. In this case additional external contact surfaces are then to be provided in the external contact-surface arrangement. The connection between the printed circuit board and the flexible carrier substrate results in part from contacting the external contact arrangement 57, 58 of the printed circuit board 55, 56 with conducting paths 23 of the carrier substrates 21, 22, 49, 50 via the internal contacts 63 arranged on the periphery of the printed circuit board and connected to the external contact arrangement by means of the connection conducting path structure 72.

Figure 6:
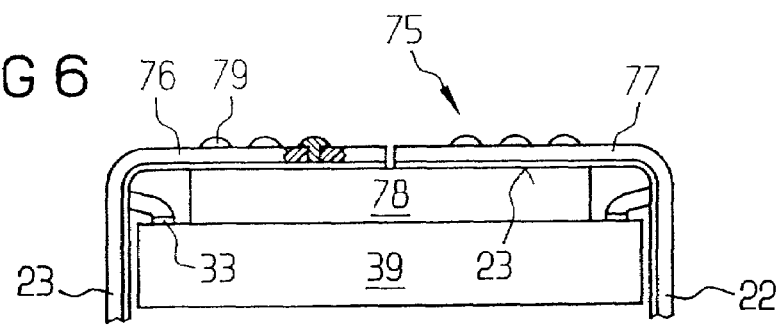
FIG. 6 a partial side view of a chip arrangement corresponding to FIG. 3.

FIG. 6 shows, here by way of example with reference to the case of a chip-stack arrangement with two carrier substrates 21, 22, another possibility for forming an external contact-surface arrangement 75. With a view to forming the external contact-surface arrangement 75, after establishing the contact of the conducting paths 23 with connection surfaces 33 of an uppermost chip 39 the carrier-substrate ends 76, 77 of the carrier substrates 21, 22 are folded over in the direction of the upper side or contact-surface side of the chip 39. For defined positioning of the carrier-substrate ends 76, 77 and securing thereof in relation to the chip 39 an adhesive spacer device 78 is interposed for example in the manner of the spacer devices 40 to 43 of the arrangement represented in FIG. 1.

With a view to forming the external contact-surface arrangement 75 the conducting paths 23 are through-contacted in the region of the carrier-substrate ends 76, 77 onto the reverse side of the carrier substrates 21, 22. This can be effected by application and remelting of solder balls in carrier-layer recesses which open out on to the reverse side of the conducting path 23, so that, as represented in FIG. 6, the external contact surfaces of the external contact-surface arrangement are formed by soldering points 79.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

What is claimed is:

1. Process for the formation of a spatial chip arrangement including a plurality of rigid chips, each of the plurality of chips having a peripheral connection surface, arranged in several planes and electrically connected to one another, comprising the steps of arranging at least two flexible carrier substrates with their conducting-path structures comprising a plurality of conducting paths located opposite one another, carrying out the arrangement by means of clamping device accommodating ends of the carrier substrates in order to fix the carrier substrates with their conducting paths located opposite one another, connecting the rigid chips via their peripheral connection surfaces to assigned conducting paths of the conducting-path structures of the flexible carrier substrates by the chips being arranged transverse to a longitudinal extent of the carrier substrate, wherein a connecting material is first applied in the form of isolated deposits of soldering material onto the conducting paths and/or the connection surfaces and is then activated by melting in order to connect the conducting-paths and the connection surfaces via the melted soldering material, the spatial chip arrangement being built up by means of a sandwich type layering of the rigid chips and connecting the rigid chips to the flexible substrates subsequently.

2. Process according to claim 1, wherein the peripheral connection surfaces arranged along at least one lateral edge of one chip are brought into a connecting position adjacent to the conducting paths and arranged transverse to the longitudinal extent of the conducting paths and then a connection is made between pairings, assigned respectively to one another, consisting of conducting path and connection surface via connection material that is applied between the respective conducting path and the assigned connection surface.

3. Process according to claim 1, wherein after a chip has been contacted an electrical examination of the chip is effected via the conducting-path structure of the carrier substrate that is connected to a test device.

4. Process according to claim 1, wherein the clamping device includes a body against which ends of the flexible carrier substrates are held by means of respective clamping members.

5. Process according to claim 1, wherein prior to contacting another chip a spacer device is arranged on the upper side of a previously contacted chip.

6. Process according to claim 1, wherein the application of the soldering material onto at least one of the conducting paths and the connection surfaces and the subsequent activation by melting the soldering material is carried out by one and the same application capillary.

* * * * *